(12) United States Patent
Li (10) Patent No.: US 10,257,946 B2
(45) Date of Patent: Apr. 9, 2019

(54) ELECTRONIC DEVICE

(71) Applicant: Lenovo (Beijing) Limited, Beijing (CN)

(72) Inventor: Xiao Hua Li, Beijing (CN)

(73) Assignee: Lenovo (Singapore) Pte. Ltd., Singapore (SG)

(*) Notice: Subject to any disclaimer, the term of this patent is extended or adjusted under 35 U.S.C. 154(b) by 0 days.

(21) Appl. No.: 15/470,343

(22) Filed: Mar. 27, 2017

(65) Prior Publication Data

US 2017/0280570 A1     Sep. 28, 2017

(30) Foreign Application Priority Data

Mar. 28, 2016 (CN) .......................... 2016 1 0184138

(51) Int. Cl.
| | |
|---|---|
| *G06F 1/16* | (2006.01) |
| *H05K 5/00* | (2006.01) |
| *H05K 7/00* | (2006.01) |
| *H05K 5/02* | (2006.01) |

(52) U.S. Cl.
CPC ......... *H05K 5/0017* (2013.01); *H05K 5/0217* (2013.01)

(58) Field of Classification Search
CPC ... G06F 1/1652; G06F 1/1601; H05K 5/0226; H05K 5/0017
USPC ............. 361/679.21, 679.22, 679.26, 679.28
See application file for complete search history.

(56) References Cited

U.S. PATENT DOCUMENTS

| | | | | |
|---|---|---|---|---|
| 7,440,265 B2* | 10/2008 | Ou Yang | ............... | G06F 1/1601 348/375 |
| 7,558,057 B1* | 7/2009 | Naksen | ................. | G06F 1/1613 361/679.3 |
| 7,667,962 B2* | 2/2010 | Mullen | ................ | G06F 1/1624 359/461 |
| 8,380,327 B2* | 2/2013 | Park | ...................... | G05B 11/01 29/592.1 |
| 8,385,059 B2* | 2/2013 | Wang | .................... | G06F 1/1626 361/679.21 |
| 8,605,421 B2* | 12/2013 | Verschoor | ............. | G06F 1/1652 361/679.21 |
| 8,654,519 B2* | 2/2014 | Visser | ...................... | G09F 9/00 361/679.21 |
| 8,724,297 B2* | 5/2014 | Tho | ...................... | B29C 70/763 361/679.01 |
| 9,558,685 B2* | 1/2017 | Lee | ........................... | G09F 9/35 |
| 9,760,129 B2* | 9/2017 | Kim | ...................... | G06F 1/1656 |
| 9,848,502 B1* | 12/2017 | Chu | ...................... | H05K 5/0226 |
| 2016/0266611 A1* | 9/2016 | Wang | .................... | G06F 1/1652 |

FOREIGN PATENT DOCUMENTS

CN       103929530 A      7/2014

* cited by examiner

*Primary Examiner* — Anthony M Haughton
(74) *Attorney, Agent, or Firm* — Ference & Associates LLC (57) ABSTRACT

One embodiment provides an electronic device, comprising: a main body component; an adjustable display component comprising a display area, a first shape, a second shape, and an assembly that is partially changeable in shape; and at least one accommodating component; wherein the main body component supports the adjustable display component and the at least one accommodating component. Other aspects are described and claimed.

18 Claims, 9 Drawing Sheets

ELECTRONIC DEVICE

CLAIM FOR PRIORITY

This application claims priority to Chinese Application No. 201610184138.0, filed on Mar. 28, 2016, which is fully incorporated by reference herein.

FIELD

The subject matter described herein relates to the technical field of electronic products and manufacturing thereof, more specifically, it relates to an electronic device.

BACKGROUND

With the promotion, popularization and development of electronic products, electronic products have increasing functions, increasingly strong performance, increasingly rich experience, and increasing types. People can enjoy various conveniences brought about by the development of technology. At present, people can enjoy a comfortable life brought about by the development of technology by way of various kinds of electronic devices. It is certain that people have increasingly high requirements regarding electronic products.

BRIEF SUMMARY

In summary, one aspect provides an electronic device, comprising: a main body component; an adjustable display component comprising a display area, a first shape, a second shape, and an assembly that is partially changeable in shape; and at least one accommodating component; wherein the main body component supports the adjustable display component and the at least one accommodating component.

Another aspect provides a product, comprising: a main body component; an adjustable display component comprising a display area, a first shape, a second shape, and an assembly that is partially changeable in shape; and at least one accommodating component; wherein the main body component supports the adjustable display component and the at least one accommodating component.

A further aspect provides a method, comprising: providing a main body component; providing an adjustable display component comprising a display area, a first shape, a second shape, and an assembly that is partially changeable in shape; and providing at least one accommodating component; wherein the main body component supports the adjustable display component and the at least one accommodating component.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Users desire to have a relatively large display screen for improving watching experience; however, they want the electronic device to be small in size, for example, a mobile phone. At present, a relatively common scheme for expanding a display screen is realized by using a flexible screen. The flexible screen is generally turned 180 degrees to expand the display screen on the electronic device. When the display screen on the electronic device does not need to be expanded, the flexible screen for expanding the screen is folded and fitted on the rear cover of the electronic device. In this way, the flexible screen protrudes from the side and bottom of the electronic device, which is likely to cause unnecessary damage and increase costs.

Figure 1:
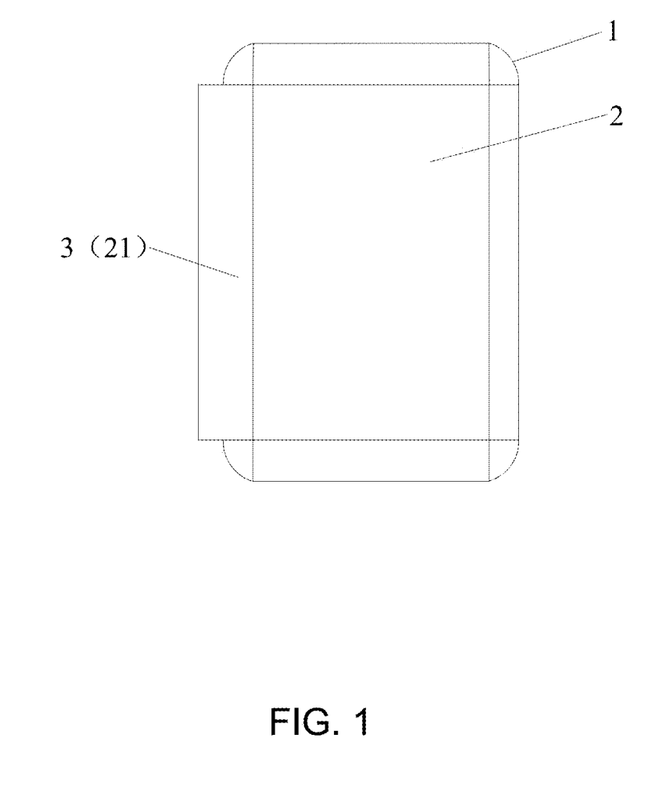
FIG. 1 is a structural schematic diagram illustrating an electronic device according to an embodiment.

Referring now to FIG. 1, a structural schematic diagram of an electronic device according to an embodiment is illustrated. As shown in FIG. 1, the device includes a main body component 1, a display component 2 and at least one accommodating component 3. The main body component 1 supports the display component 2 and the at least one accommodating component 3. The display component 2 includes an assembly 21 that is at least partially changeable in shape. When the display component 2 is in a first shape, the assembly that is at least partially changeable in shape is accommodated in the accommodating component 3. When the display component 2 is in a second shape, the assembly that is at least partially changeable in shape is at least partially away from the accommodating component 3. A display area of the display component in the second shape is greater than that of the display component in the first shape.

In FIG. 1, in an embodiment, the accommodating component is arranged at one side of the main body component. When the display component is in the first shape, the assembly that is at least partially changeable in shape is entirely accommodated in the accommodating component. At this time, a display area of the electronic device is composed of only a display screen on the electronic device. When the display component is in the second shape, the assembly that is at least partially changeable in shape is partially accommodated in the accommodating component. At this time, the display area of the electronic device is composed of the display screen on the electronic device and an assembly that is at least partially changeable in shape, is in a stretched state, and is not accommodated in the accommodating component.

In an embodiment, the electronic device includes a main body component, a display component, and at least one accommodating component. The main body component supports the display component and the at least one accommodating component. The display component includes an assembly that is at least partially changeable in shape. When the display component is in a first shape, the assembly that is at least partially changeable in shape is accommodated in the accommodating component. When the display component is in a second shape, the assembly that is at least partially changeable in shape is at least partially away from the accommodating component. In this way, a display screen on the electronic device can be expanded freely according to users' requirements without screen protrusion. This solves a problem that a flexible screen protrudes in an existing display screen expansion scheme and thereby reduces unnecessary damage, lowers costs, and avoids waste while implementing expansion of the display screen on the electronic device.

Figure 2:
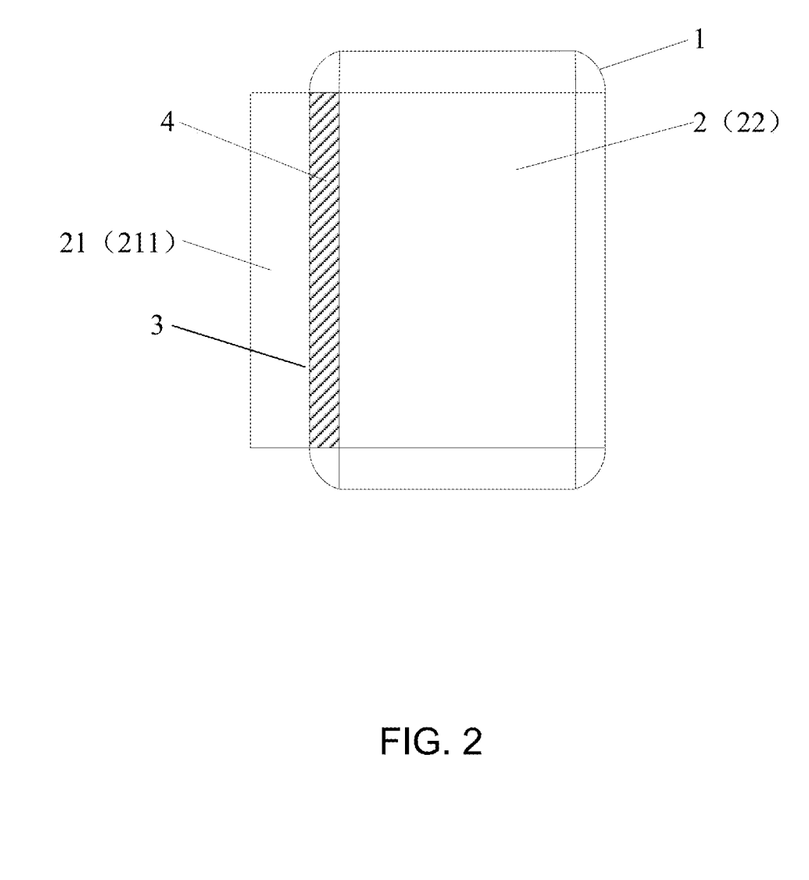
FIG. 2 is a structural schematic diagram illustrating an electronic device according to an embodiment.

Referring now to FIG. 2, a structural schematic diagram of an electronic device according to an embodiment is illustrated. As shown in FIG. 2, the device includes a main body component 1, a display component 2, at least one accommodating component 3, and a connecting component 4. The at least one accommodating component 3 is located on at least one side of the main body component 1. The display component 2 is composed of a base subcomponent 22 and an assembly 21 that is at least partially changeable in shape, wherein the assembly 21 that is at least partially changeable in shape includes an expanding subcomponent 211, and the expanding subcomponent 211 can generate deformation in response to stress. The accommodating component 3 is configured to accommodate the entire expanding subcomponent 211 in a first shape when a distance from the accommodating component to the main body component 1 is at a minimum distance, so that a display area of the display component 2 is composed of the base subcomponent 22. The accommodating component 3 is further configured to accommodate a first partial expanding subcomponent 211 in a second shape when the distance from the accommodating component to the main body component 1 is greater than the minimum distance, so that the display area of the display component 2 is jointly composed of a remaining expanding subcomponent except for the first partial expanding subcomponent 211 and the base subcomponent 22.

In an embodiment, one accommodating component is included, as shown in FIG. 2. The base subcomponent of the display component can be located on the main body component, and the expanding subcomponent of the display component can be entirely located in the accommodating component. Alternatively, the expanding subcomponent is partially located in the accommodating component. Specifically, when the distance from the accommodating component to the main body component is the minimum distance, the distance from the accommodating component to the main body component is preferably zero. At this time, the expanding subcomponent can be entirely accommodated in the accommodating component and the display component of the electronic device is composed of only the base subcomponent. When the distance from the accommodating component to the main body component is greater than the minimum distance, the distance from the accommodating component to the main body component is preferably greater than zero. At this time, the expanding subcomponents can be partially accommodated in the accommodating component, and the display component of the electronic device, namely, the display screen, can be composed of the base subcomponent and the partial expanding subcomponent. Alternatively, when the distance from the accommodating main body to the main body component is great enough so that the expanding subcomponent cannot be stretched any more, the expanding subcomponent is completely in a stretched state, and an expanding subcomponent connected to the accommodating component is accommodated in the accommodating component so that the size of the display screen on the electronic device is at its largest.

In an embodiment, a display screen of the expanding subcomponent of the display component can be a flexible screen, and a display screen of the base subcomponent can be a currently common hard screen or a same flexible screen as that of the expanding subcomponent. When the display screen of the base subcomponent and the display screen of the expanding subcomponent are flexible screens, the base subcomponent can be integrally connected to the expanding subcomponent.

In an embodiment, the connecting component 4 is configured to connect the main body component 1 and the at least one accommodating component 3. When the display area of the display component is jointly composed of the remaining expanding subcomponent except for the first partial expanding subcomponent and the base subcomponent, the connecting component 4 is further configured to provide supporting force for the remaining subcomponent except for the first partial expanding subcomponent. Specifically, the connecting component serves to connect the main body component and the accommodating component. Meanwhile, after the expanding subcomponent is stretched and expanded, the connecting component can provide supporting force for an expanding subcomponent that is in a stretched state and is not accommodated in the accommodating component. In this way, hardness of the flexible display screen can be increased by using the supporting force of the connecting component, thereby ensuring the expanding subcomponent in the stretched state can function normally.

Figure 3:
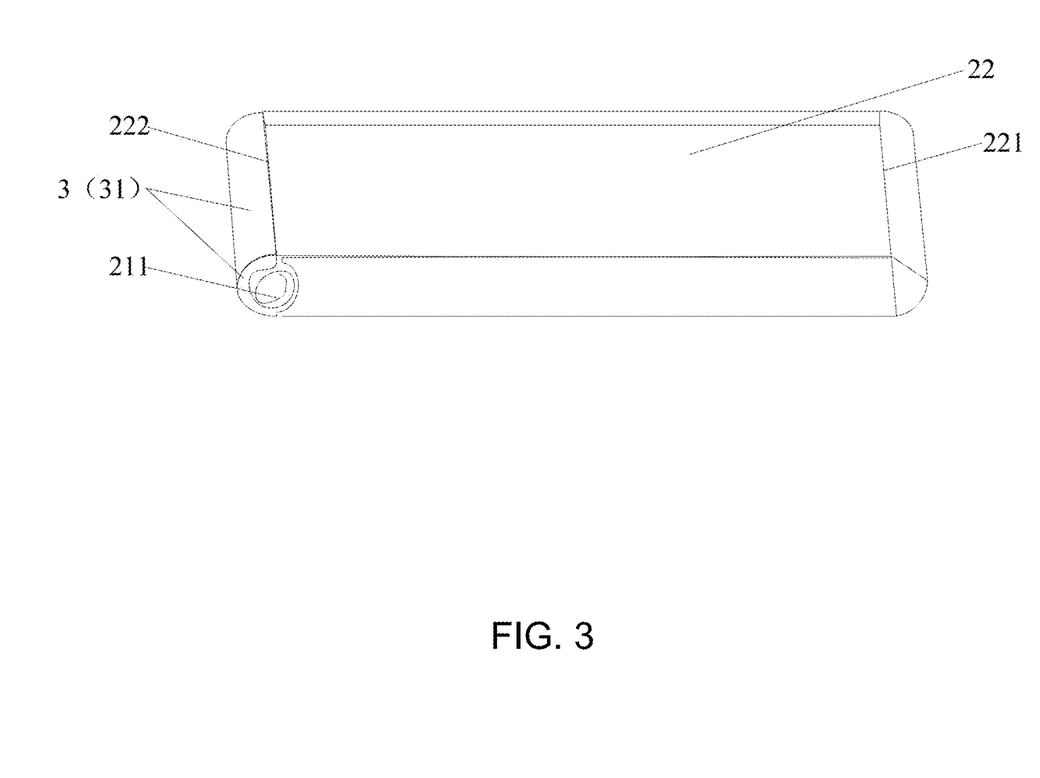
FIG. 3 is a structural schematic diagram illustrating an electronic device according to an embodiment.

Referring now to FIG. 3, in an embodiment, the at least one accommodating component 3 includes an accommodating subcomponent 31. The base subcomponent 22 includes a first end 221 and a second end 222 relative to the first end. The first end 221 is arranged on the main body component 1 and the second end 222 is connected to the accommodating subcomponent 31. The expanding subcomponent 211 is wound inside of the accommodating subcomponent 31. A display area of the display component 2 along a direction vertical to a direction of the first end is changeable.

The display component can be a display screen on the electronic device. The base subcomponent of the display component can be a display area of the electronic device arranged on the main body component. The expanding subcomponent of the display component can be a display screen that is accommodated in the accommodating subcomponent to expand a display area of the electronic device.

Figure 4:
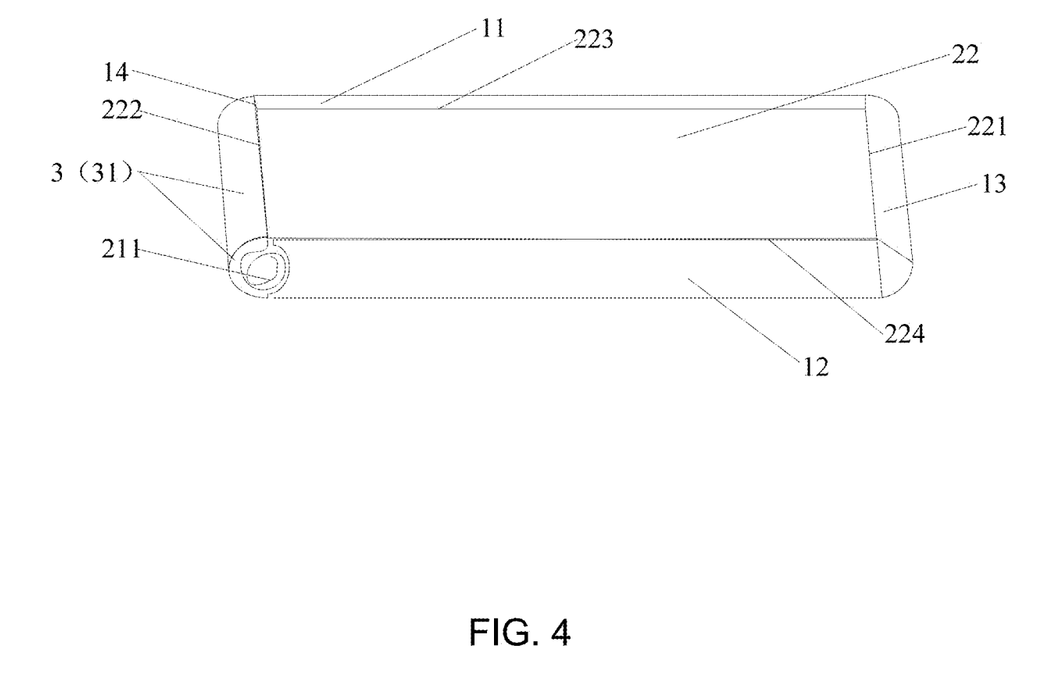
FIG. 4 is a structural schematic diagram illustrating an electronic device according to an embodiment.

Referring now to FIG. 4, in an embodiment, the main body component 1 includes a first frame 11, a second frame 12 relative to the first frame 11, a third frame 13, and a fourth frame 14 relative to the third frame 13. The base subcomponent 22 further includes a third end 223 and a fourth end 224 relative to the third end 223. The first frame 11 and the second frame 12 are stretchable frames, the first end 221 of the base subcomponent 22 is arranged on the third frame 13, the accommodating subcomponent 31 is arranged on the fourth frame 14, and the third end 223 and the fourth end 224 of the base subcomponent 22 are respectively arranged on the first frame 11 and the second frame 12.

Figure 5:
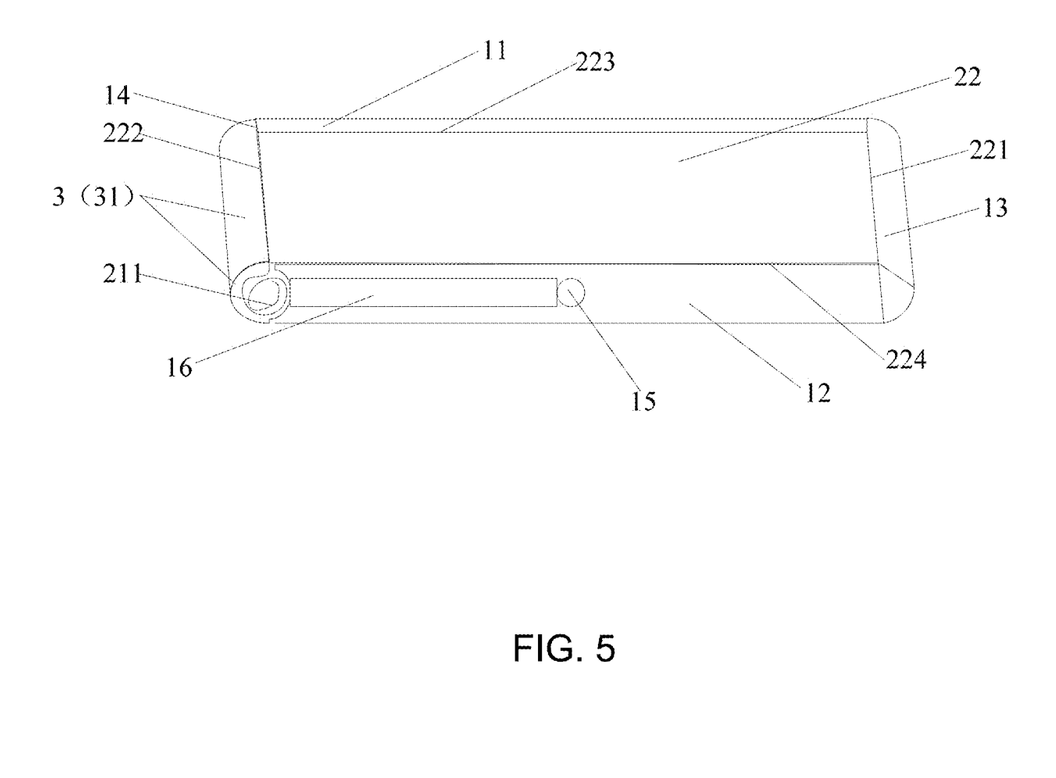
FIG. 5 is a structural schematic diagram illustrating an electronic device according to an embodiment.

In an embodiment, the accommodating component of the electronic device shown in FIGS. 3-5 includes only one accommodating subcomponent. The accommodating subcomponent shown in the figures is arranged on the fourth frame of the main body component, and certainly, the accommodating subcomponent can be arranged on the third frame of the main body component. A display area of the display component along a direction of the first frame and the second frame of the main body component is changeable. The first frame and the second frame of the main body component are stretchable frames, so as to better ensure stretching of the expanding subcomponent and that a user can normally perform touch control on a display area of this part after stretching.

Referring now to FIG. 5, in an embodiment, the main body component 1 further includes a control component 15 and a transmission component 16. The control component 15 is arranged on the main body component 1 and one end of the transmission component 16 is connected to the control component 15 and the other end of the transmission component 16 is connected to the accommodating subcomponent 31.

As shown in FIG. 5, in an embodiment, the control component, a first transmission component, and a second transmission component can be arranged on the second frame 12 of the main body component. In another embodiment, the control component, the first transmission component and the second transmission component can also be arranged on the first frame 11 of the main body component. Alternatively, in an embodiment, the control component, the first transmission component and the second transmission component can be arranged on the first frame 11 and the second frame 11 of the main body component simultaneously.

In an embodiment, the control component 15 and the transmission component 16 are configured to control flexibility of the accommodating subcomponent 31. The control component can control the accommodating subcomponent to stretch or shrink by using the transmission component, so as to ensure normal stretching or shrinking of the expanding subcomponent. In this way, when a display area of the electronic device needs to be expanded, the display area of the display area can be expanded by pressing a control assembly by a user. Meanwhile, when the electronic device does not need to be used, the display area of the electronic device can be shrunk and accommodated in the accommodating subcomponent by pressing a control component and only the base subcomponent of the electronic device is kept, namely, a fixed display screen, facilitating carriage of the electronic device.

In an embodiment, a displacement sensor is arranged on the at least one accommodating component 3. The base subcomponent can be a fixed display screen and the expanding subcomponent can be a flexible display screen. One end of the expanding subcomponent is fixed on the main body component, and one end is wound inside of the accommodating component. An expanding area of the expanding subcomponent (flexible display screen) can be obtained by setting the displacement sensor on the accommodating component, so as to further determine the display area of the electronic device.

In an embodiment, the base subcomponent and the expanding subcomponent can be jointly or separately displayed. The base subcomponent can be the fixed display screen and the expanding subcomponent can be the flexible display screen. In an embodiment, the fixed display screen and the flexible display screen can display the same picture at the same time. In an embodiment, the fixed display screen and the flexible display screen may display different pictures. In an embodiment, one of the fixed display screen or the flexible display screen displays a picture while the other is closed. For example, the fixed display screen displays a picture, and the flexible display screen is accommodated in the accommodating subcomponent.

The electronic device, according to an embodiment, includes a main body component, a display component, and at least one accommodating component, wherein the main body component supports the display component and the at least one accommodating component. The display component includes an assembly that is at least partially changeable in shape. When the display component is in a first shape, the assembly that is at least partially changeable in shape is accommodated in the accommodating component. When the display component is in a second shape, the assembly that is at least partially changeable in shape is at least partially away from the accommodating component. In this way, a display screen on the electronic device can be expanded freely according to users' requirements without screen protrusion, which solves a problem that a flexible screen protrudes in an existing display screen expansion scheme, thereby reducing unnecessary damage, greatly lowering costs, and avoiding waste while implementing expansion of the display screen on the electronic device.

Figure 6:
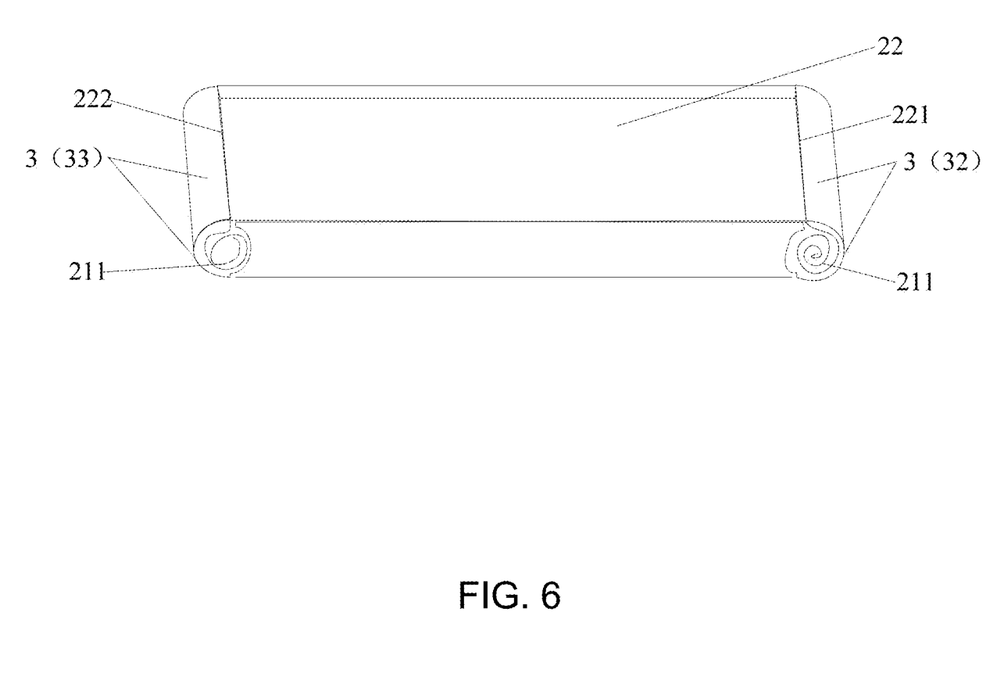
FIG. 6 is a structural schematic diagram illustrating an electronic device according to an embodiment.

Referring now to FIG. 6, a structural schematic diagram of an electronic device according to an embodiment is illustrated. As shown in FIG. 6, the device includes a main body component 1, a display component 2, at least one accommodating component 3, and a connecting component 4. The at least one accommodating component 3 includes a first accommodating subcomponent 32 and a second accommodating subcomponent 33. The at least one accommodating component 3 is located on at least one side of the main body component 1. The display component 2 is composed of a base subcomponent 22 and an expanding subcomponent 211, wherein the expanding subcomponent 211 can generate deformation in response to stress. The accommodating component 3 is configured to accommodate the entire expanding subcomponent 211 in a first shape when a distance from the accommodating component to the main body component 1 is at a minimum distance, so that a display area of the display component 2 is composed of the base subcomponent 21.

In an embodiment, the accommodating component 3 is further configured to accommodate a first partial expanding subcomponent 211 in a second shape when the distance from the accommodating component to the main body component 1 is greater than the minimum distance, so that the display area of the display component 2 is jointly composed of a remaining expanding subcomponent 211 except for the first partial expanding subcomponent 211 and the base subcomponent 22. The connecting component 4 is configured to connect the main body component 1 and the at least one accommodating component 3.

When the display area of the display component is jointly composed of the remaining expanding subcomponent except for the first partial expanding subcomponent and the base subcomponent, the connecting component 4 is further configured to provide supporting force for the remaining subcomponent except for the first partial expanding subcomponent.

Figure 7:
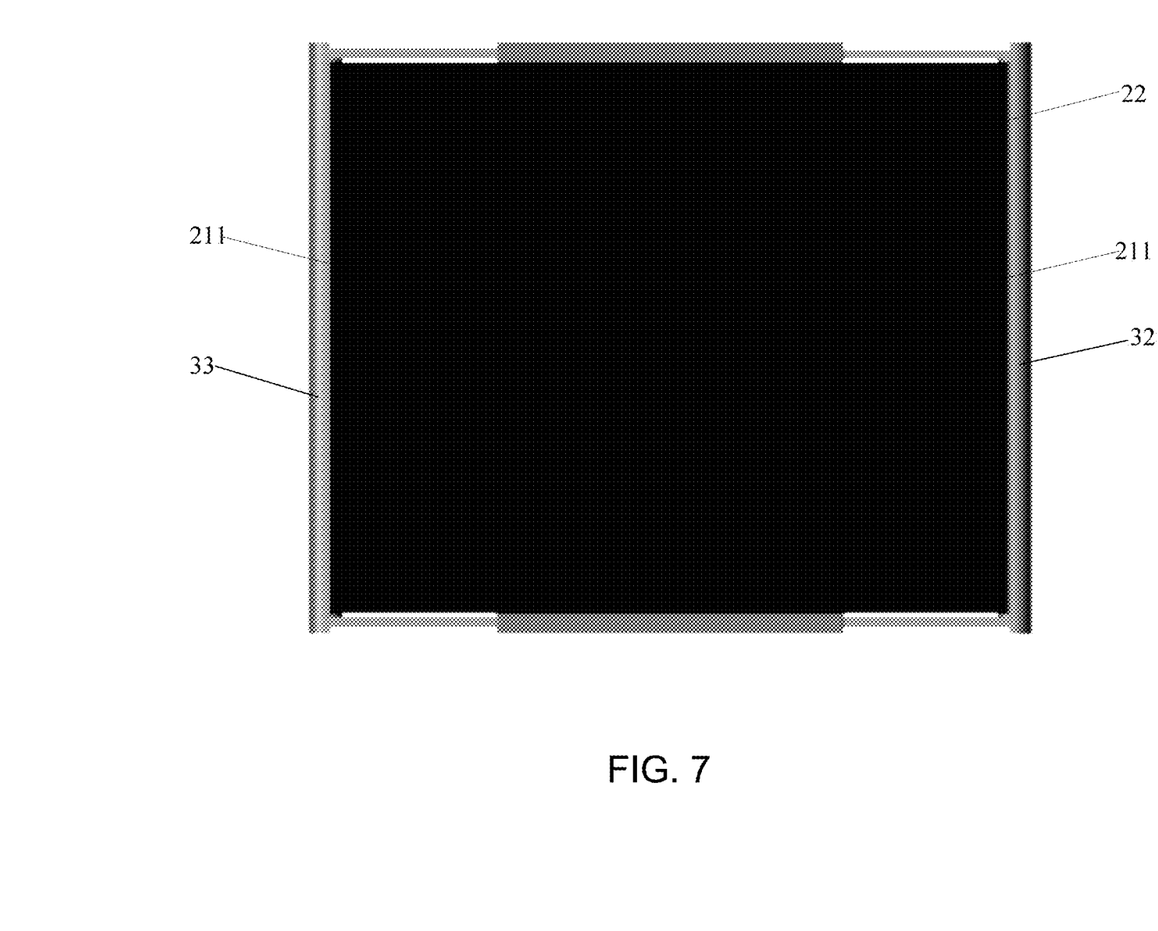
FIG. 7 is a structural schematic diagram illustrating an electronic device according to an embodiment.

As shown in FIG. 7, in an embodiment, the expanding subcomponent can be arranged in the first accommodating subcomponent and the second accommodating subcomponent separately. When a display area of the electronic device needs to be expanded, the expanding subcomponent can be stretched by using the first accommodating subcomponent and the second accommodating subcomponent simultaneously to implement expansion of the display area of the electronic device. Certainly, the expanding subcomponent can be stretched by using any of the first accommodating subcomponent and the second accommodating subcomponent to implement expansion of the display area of the electronic device.

In an embodiment, the base subcomponent 22 includes a first end 221 and a second end 222 relative to the first end 221. The first end 221 is connected to the first accommodating subcomponent 32, and the second end 222 is connected to the second accommodating subcomponent 33. The expanding subcomponent 211 is wound inside of the first accommodating subcomponent 32 and the second accommodating subcomponent 33 simultaneously. A display area of the display component along a direction vertical to a direction of the first end is changeable.

Figure 8:
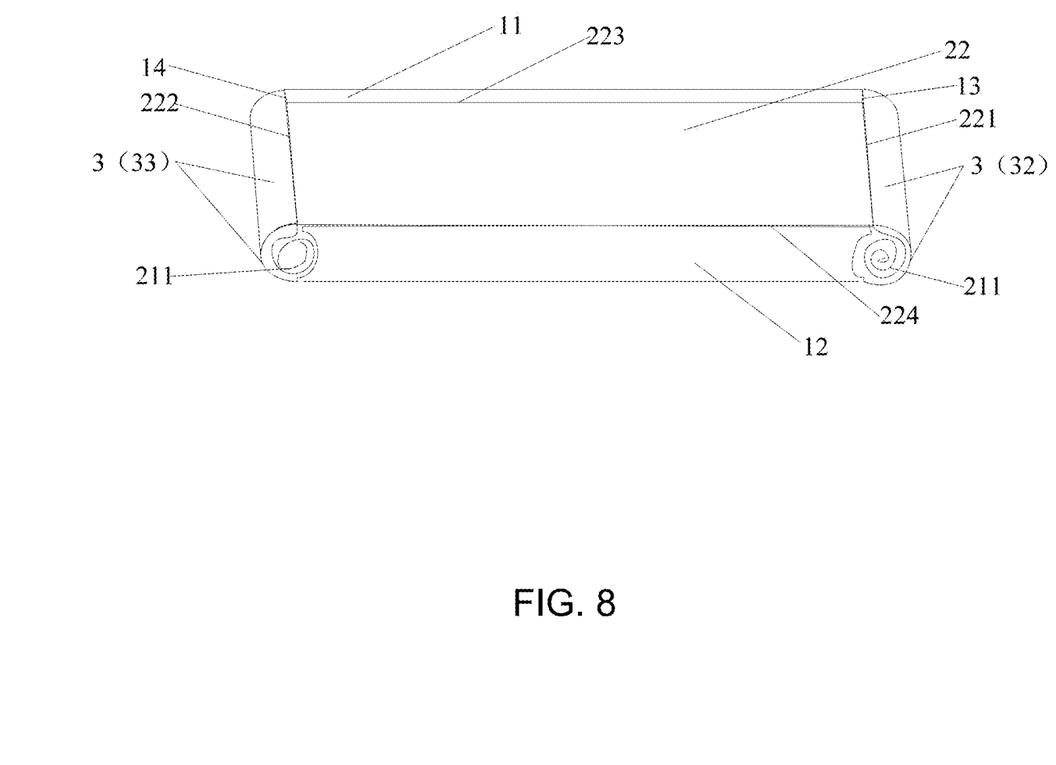
FIG. 8 is a structural schematic diagram illustrating an electronic device according to an embodiment.

As shown in FIG. 8, in an embodiment, the main body component 1 includes a first frame 11, a second frame 12 relative to the first frame 11, a third frame 13 and a fourth frame 14 relative to the third frame 13. The base subcomponent 22 further includes a third end 223 and a fourth end 224 relative to the third end. The first frame 11 and the second frame 12 are stretchable frames, the first accommodating subcomponent 32 is arranged on the third frame 13, the second accommodating subcomponent 33 is arranged on the fourth frame 14, and the third end 223 and the fourth end 224 of the base subcomponent 22 are respectively arranged on the first frame 11 and the second frame 12.

Figure 9:
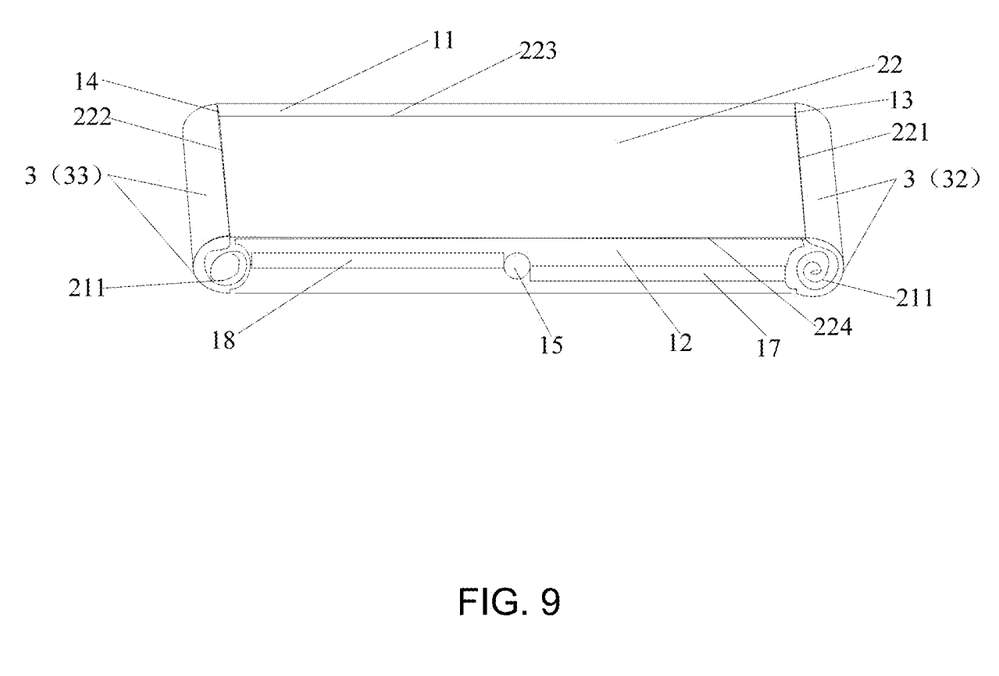
FIG. 9 is a structural schematic diagram illustrating an electronic device according to an embodiment.

Further, as shown in FIG. 9, in an embodiment, the main body component 1 includes a control component 15, a first transmission component 17, and a second transmission component 18. The control component 15 is arranged on the main body component 1. One end of the first transmission component 17 is connected to the control component 15 and the other end of the first transmission component 17 is connected to the first accommodating subcomponent 32. One end of the second transmission component 18 is connected to the control component 15 and the other end of the second transmission component 18 is connected to the second accommodating subcomponent 33. The control component, the first transmission component, and the second transmission component control flexibility of the first accommodating subcomponent and the second accommodating subcomponent simultaneously.

As shown in FIG. 9, in an embodiment, the control component, the first transmission component, and the second transmission component can be arranged on the second frame 12 of the main body component. Certainly, the control component, the first transmission component and the second transmission component can also be arranged on the first frame 11 of the main body component. Alternatively, in an embodiment, the control component, the first transmission component and the second transmission component can be arranged on the first frame 11 and the second frame 12 of the main body component simultaneously.

In an embodiment, the control component can control the first accommodating subcomponent 32 to stretch or shrink by using the first transmission component 17 and can simultaneously control the second accommodating subcomponent 33 to stretch or shrink by using the second transmission component 18. Alternatively, in an embodiment, the control component can respectively control the first accommodating subcomponent 32 to stretch or shrink by using the first transmission component 17 and the second accommodating subcomponent 33 to stretch or shrink by using the second transmission component 18, so as to ensure normal stretching or shrinking of the expanding subcomponent. In this way, when a display area of the electronic device needs to be expanded, the display area of the display area can be expanded by pressing a control assembly by a user. Meanwhile, when the electronic device does not need to be used, the display area of the electronic device can be shrunk and accommodated in the accommodating subcomponent by pressing a control component. Only the base subcomponent of the electronic device is kept, namely, a fixed display screen, facilitating carriage of the electronic device.

A displacement sensor is arranged on the at least one accommodating component. In an embodiment, the displacement sensor can be arranged on the first accommodating subcomponent and the second accommodating subcomponent respectively. An expanding area of the expanding subcomponent (flexible display screen) can be obtained by setting the displacement sensor on the first accommodating component and the second accommodating component, so as to further determine the display area of the electronic device. The base subcomponent and the expanding subcomponent can be jointly or independently displayed.

In an embodiment, the accommodating component of the electronic device shown in FIGS. 6 to 9 can include the first accommodating subcomponent and the second accommodating subcomponent. The first accommodating subcomponent 32 shown in FIGS. 6 to 9 is arranged on the third frame 13 of the main body component and the second accommodating subcomponent 33 is arranged on the fourth frame 14 of the main body component. Certainly, the first accommodating subcomponent 32 can be arranged on the fourth frame 14 of the main body component and the second accommodating subcomponent 33 can be arranged on the third frame 13 of the main body component.

In an embodiment, the electronic device includes a main body component, a display component, and at least one accommodating component. The main body component supports the display component and the at least one accommodating component. The display component includes an assembly that is at least partially changeable in shape. When the display component is in a first shape, the assembly that is at least partially changeable in shape is accommodated in the accommodating component. When the display component is in a second shape, the assembly that is at least partially changeable in shape is at least partially away from the accommodating component. In this way, a display screen on the electronic device can be expanded freely according to users' requirements without screen protrusion, which solves a problem that a flexible screen protrudes in an existing display screen expansion scheme, thereby reducing unnecessary damage, greatly lowering costs, and avoiding waste while implementing expansion of the display screen on the electronic device.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

It should be noted that the various functions described herein may be implemented using instructions stored on a device readable storage medium such as a non-signal storage device that are executed by a processor. A storage device may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage device is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example embodiments are described herein with reference to the figures, which illustrate example methods, devices and program products according to various example embodiments. It will be understood that the actions and functionality may be implemented at least in part by program instructions. These program instructions may be provided to a processor of a device, a special purpose information handling device, or other programmable data processing device to produce a machine, such that the instructions, which execute via a processor of the device implement the functions/acts specified.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. An electronic device, comprising:
   a main body component;
   an adjustable display component comprising a display area, wherein the display area is adjustable between a first size and a second size, wherein the second size is larger than the first size; and
   at least two accommodating components, wherein each of the at least two accommodating components constitute an extendable external side edge of the electronic device, each of the extendable external side edges being disposed opposite the other, and house portions of the adjustable display component;
   wherein the main body component supports the adjustable display component and the at least two accommodating components.

2. The electronic device of claim 1, wherein the adjustable display component is secured in the at least one accommodating component in the first size and wherein the adjustable display component is at least partially away from the at least one accommodating component in the second size.

3. The electronic device of claim 1, wherein the main body component comprises a first frame, a second frame relative to the first frame, a third frame, and a fourth frame relative to the third frame.

4. The electronic device of claim 3, further comprising a base subcomponent and an expanding subcomponent, wherein the base subcomponent is associated with a portion of the adjustable display component not housed in the at least two accommodating components and wherein the expanding subcomponent is associated with a portion of the adjustable display component housed in the at least two accommodating components.

5. The electronic device of claim 4, further comprising a connecting component that is configured to connect the main body component and the at least two accommodating components, wherein the connecting component is configured to provide supporting force when the display area is adjusted between the first size and the second size.

6. The electronic device of claim 4, wherein the at least two accommodating components each comprise an accommodating subcomponent and wherein the base subcomponent comprises a first end and a second end relative to the first end;
   wherein the first end is arranged on the main body component, the second end is connected to the accommodating subcomponent, and the expanding subcomponent is wound inside of the accommodating subcomponent.

7. The electronic device of claim 6, wherein the main body component further comprises a control component and a transmission component, wherein the control component and the transmission component are configured to control the flexibility of the accommodating subcomponent.

8. The electronic device of claim 6, wherein the base subcomponent further comprises a third end and a fourth end relative to the third end; and
the first frame and the second frame are stretchable frames, the first end of the base subcomponent is arranged on the third frame, the accommodating subcomponent is arranged on the fourth frame, and the third end and the fourth end of the base subcomponent are respectively arranged on the first frame and the second frame.

9. The electronic device of claim 4, wherein the at least two accommodating components comprise a first accommodating subcomponent and a second accommodating subcomponent; wherein the first accommodating subcomponent is connected to a first end of the base subcomponent and wherein the second accommodating subcomponent is connected to a second end of the base subcomponent and wherein the expanding subcomponent is wound inside of the first accommodating subcomponent and the second accommodating subcomponent simultaneously.

10. The electronic device of claim 9, wherein the base subcomponent further comprises a third end and a fourth end relative to the third end; and the first frame and the second frame are stretchable frames, the first accommodating subcomponent is arranged on the third frame, the second accommodating subcomponent is arranged on the fourth frame, and the third end and the fourth end of the base subcomponent are respectively arranged on the first frame and the second frame.

11. The electronic device of claim 1, wherein a displacement sensor is arranged on the at least one accommodating component.

12. A product, comprising:
a main body component;
an adjustable display component comprising a display area, wherein the display area is adjustable between a first size and a second size, wherein the second size is larger than the first size; and
at least two accommodating components, wherein each of the at least two accommodating components constitute an extendable external side edge of the electronic device, each of the extendable external side edges being disposed opposite the other, and house portions of the adjustable display component;
wherein the main body component supports the adjustable display component and the at least two accommodating components.

13. The product of claim 12, wherein the adjustable display component is secured in the at least two accommodating components in the first size and wherein the adjustable display component is at least partially away from the at least two accommodating components in the second size.

14. The product of claim 12, further comprising a base subcomponent and an expanding subcomponent, wherein the base subcomponent is associated with a portion of the adjustable display component not housed in the at least two accommodating components and wherein the expanding subcomponent is associated with a portion of the adjustable display component housed in the at least two accommodating components.

15. The product of claim 14, further comprising a connecting component that is configured to connect the main body component and the at least two accommodating components, wherein the connecting component is configured to provide supporting force when the display area is adjusted between the first size and the second size.

16. The product of claim 14, wherein the at least two accommodating components each comprise an accommodating subcomponent and wherein the base subcomponent comprises a first end and a second end relative to the first end;
wherein the first end is arranged on the main body component, the second end is connected to the accommodating subcomponent, and the expanding subcomponent is wound inside of the accommodating subcomponent.

17. The product of claim 14, wherein the at least one accommodating component comprises a first accommodating subcomponent and a second accommodating subcomponent; wherein the first accommodating subcomponent is connected to a first end of the base subcomponent and wherein the second accommodating subcomponent is connected to a second end of the base subcomponent and wherein the expanding subcomponent is wound inside of the first accommodating subcomponent and the second accommodating subcomponent simultaneously.

18. A method, comprising:
providing a main body component;
providing an adjustable display component comprising a display area, wherein the display area is adjustable between a first size and a second size, wherein the second size is larger than the first size; and
providing at least two accommodating components, wherein each of the at least two accommodating components constitute an extendable external side edge of the electronic device, each of the extendable external side edges being disposed the other, and house portions of the adjustable display component;
wherein the main body component supports the adjustable display component and the at least two accommodating components.

* * * * *

UNITED STATES PATENT AND TRADEMARK OFFICE
CERTIFICATE OF CORRECTION

Page 1 of 1

PATENT NO. : 10,257,946 B2
APPLICATION NO. : 15/470343
DATED : April 9, 2019
INVENTOR(S) : Xiao Hua Li It is certified that error appears in the above-identified patent and that said Letters Patent is hereby corrected as shown below:

On the Title Page

Item (73): DELETE "Lenovo (Singapore) Pte. Ltd., Singapore (SG)"
INSERT therefor --Lenovo (Beijing) Limited, Beijing (CN)--

Signed and Sealed this
First Day of June, 2021

Drew Hirshfeld
*Performing the Functions and Duties of the
Under Secretary of Commerce for Intellectual Property and
Director of the United States Patent and Trademark Office*